United States Patent
Itoh et al.

(10) Patent No.: US 9,615,495 B2
(45) Date of Patent: *Apr. 4, 2017

(54) ELECTRONIC COMPONENT MOUNTING SYSTEM AND ELECTRONIC COMPONENT MOUNTING METHOD

(71) Applicant: Panasonic Intellectual Property Management Co., Ltd., Osaka (JP)

(72) Inventors: Katsuhiko Itoh, Yamanashi (JP); Nobuo Komiya, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/443,491

(22) PCT Filed: Nov. 15, 2013

(86) PCT No.: PCT/JP2013/006729
§ 371 (c)(1),
(2) Date: May 18, 2015

(87) PCT Pub. No.: WO2014/076970
PCT Pub. Date: May 22, 2014

(65) Prior Publication Data
US 2015/0271963 A1    Sep. 24, 2015

(30) Foreign Application Priority Data

Nov. 19, 2012  (JP) ................................. 2012-252954
Nov. 20, 2012  (JP) ................................. 2012-253979

(51) Int. Cl.
*B23K 31/02*    (2006.01)
*H05K 13/04*    (2006.01)
(Continued)

(52) U.S. Cl.
CPC ....... *H05K 13/0465* (2013.01); *B23K 3/0607* (2013.01); *B23K 3/0638* (2013.01);
(Continued)

(58) Field of Classification Search
None
See application file for complete search history.

(56) References Cited

U.S. PATENT DOCUMENTS 5,436,028 A * 7/1995 Becher ................. H05K 3/1216
427/282
5,555,316 A * 9/1996 Tsujikawa ............. G06T 7/0006
348/126

(Continued)

FOREIGN PATENT DOCUMENTS

CN    101686635 A  *  3/2010
CN    102164473 A     8/2011
(Continued)

OTHER PUBLICATIONS

International Search Report for Application No. PCT/JP2013/006726 dated Feb. 4, 2014.
(Continued)

*Primary Examiner* — Kiley Stoner
(74) *Attorney, Agent, or Firm* — Pearne & Gordon LLP

(57) ABSTRACT

An electronic component is mounted on a substrate according to a mounting mode which is set in advance in the following mounting information—when component mounting work is performed. In the mounting information, any one of a first mounting mode in which an electronic component is transferred and mounted to a mounting position which is corrected based on a positional-shift amount between a position of a printed solder and a position of an electrode and a second mounting mode in which the electronic component is transferred and mounted to the mounting position by (Continued)

considering only the position of the electrode as a reference, is set as a mounting mode for performance for each electronic component mounting device.

2 Claims, 12 Drawing Sheets

(51) Int. Cl.
    *B23K 3/06*         (2006.01)
    *H05K 13/08*      (2006.01)
    *H05K 3/34*       (2006.01)
    *H05K 13/00*      (2006.01)
    *H05K 13/02*      (2006.01)
    *H05K 3/30*       (2006.01)

(52) U.S. Cl.
    CPC ......... *H05K 3/341* (2013.01); *H05K 13/0015* (2013.01); *H05K 13/0023* (2013.01); *H05K 13/021* (2013.01); *H05K 13/08* (2013.01); *H05K 3/303* (2013.01); *H05K 2203/04* (2013.01); *H05K 2203/166* (2013.01)

(56) References Cited

U.S. PATENT DOCUMENTS

| | | | | |
|---|---|---|---|---|
| 5,560,533 | A * | 10/1996 | Maenishi | B23K 1/0016 228/102 |
| 5,701,821 | A * | 12/1997 | Asai | B41F 35/005 101/424 |
| 5,800,856 | A * | 9/1998 | Hong Vuong | B23K 3/0638 101/127 |
| 6,635,308 | B1 * | 10/2003 | Forrest | H05K 3/3415 101/129 |
| 6,775,899 | B1 * | 8/2004 | Tomomatsu | G01N 21/95684 29/593 |
| 6,904,672 | B2 | 6/2005 | Nagafuku | |
| 2002/0070460 | A1 | 6/2002 | Uchida | |
| 2002/0083570 | A1 * | 7/2002 | Inoue | H05K 13/0465 29/428 |
| 2002/0157488 | A1 | 10/2002 | Nagafuku | |
| 2003/0029033 | A1 | 2/2003 | Hidese | |
| 2005/0077340 | A1 | 4/2005 | Nagafuku | |
| 2005/0162644 | A1 * | 7/2005 | Watanabe | G01N 21/95684 356/237.1 |
| 2008/0014772 | A1 * | 1/2008 | Ogura | H05K 3/303 439/83 |
| 2008/0289175 | A1 | 11/2008 | Inoue et al. | |
| 2009/0202143 | A1 * | 8/2009 | Mamiya | H05K 3/3484 382/150 |
| 2009/0293265 | A1 * | 12/2009 | Inoue | H05K 13/08 29/739 |
| 2010/0001042 | A1 | 1/2010 | Nagai | |
| 2010/0071195 | A1 | 3/2010 | Kihara | |
| 2010/0152877 | A1 * | 6/2010 | Maenishi | H05K 13/0452 700/108 |
| 2010/0230472 | A1 * | 9/2010 | Okamoto | H05K 3/3436 228/104 |
| 2012/0012645 | A1 * | 1/2012 | Motomura | H05K 3/363 228/179.1 |
| 2012/0014084 | A1 * | 1/2012 | Motomura | B23K 3/0638 361/807 |
| 2012/0060357 | A1 * | 3/2012 | Kaida | H05K 13/0413 29/593 |
| 2012/0317803 | A1 * | 12/2012 | Kitagawa | H05K 13/0452 29/832 |
| 2012/0317804 | A1 * | 12/2012 | Endo | H05K 13/0413 29/832 |
| 2013/0075135 | A1 * | 3/2013 | Mok | G03F 9/00 174/250 |
| 2013/0247368 | A1 * | 9/2013 | Kawase | H05K 13/0452 29/832 |
| 2013/0247369 | A1 * | 9/2013 | Kawase | H05K 13/0452 29/832 |
| 2013/0247370 | A1 * | 9/2013 | Kawase | H05K 13/0452 29/832 |
| 2014/0047990 | A1 * | 2/2014 | Fujii | B41F 15/0881 101/123 |
| 2014/0157591 | A1 * | 6/2014 | Nagai | H05K 13/08 29/739 |
| 2014/0158751 | A1 * | 6/2014 | Motomura | H05K 13/0465 228/248.1 |
| 2015/0033555 | A1 * | 2/2015 | Mizokami | H05K 13/0417 29/832 |
| 2015/0075721 | A1 * | 3/2015 | Mantani | H05K 3/368 156/387 |
| 2015/0136837 | A1 * | 5/2015 | Maeda | H05K 13/08 228/102 |
| 2015/0220081 | A1 * | 8/2015 | Morita | G05B 19/41865 700/99 |
| 2015/0243108 | A1 * | 8/2015 | Nakayama | H05K 13/08 702/81 |
| 2015/0271925 | A1 * | 9/2015 | Mori | H05K 13/0452 29/832 |
| 2015/0351295 | A1 * | 12/2015 | Itoh | H05K 13/08 228/102 |

FOREIGN PATENT DOCUMENTS

| | | | |
|---|---|---|---|
| EP | 1239719 | A2 | 9/2002 |
| JP | 04276692 | A * | 10/1992 |
| JP | 2001219533 | A * | 8/2001 |
| JP | 2003-229699 | A | 8/2003 |
| JP | 2004-087651 | A | 3/2004 |
| JP | 2006-019554 | A | 1/2006 |
| JP | 2006108200 | A * | 4/2006 |
| JP | 2006-319378 | A | 11/2006 |
| JP | 3983274 | B2 | 7/2007 |
| JP | 2007-220837 | A | 8/2007 |
| JP | 2008-072034 | A | 3/2008 |
| JP | 2008-072035 | A | 3/2008 |
| JP | 2008-270696 | A | 11/2008 |
| JP | 2008-294033 | A | 12/2008 |
| JP | 4367524 | B2 | 9/2009 |
| JP | 2009-224766 | A | 10/2009 |
| JP | 2010-003824 | A | 1/2010 |
| JP | 2011-091181 | A | 5/2011 |
| JP | 2011-171343 | A | 9/2011 |
| JP | 4996634 | A | 5/2012 |
| JP | WO 2012098892 | A1 * | 7/2012 ......... H05K 13/0452 |

OTHER PUBLICATIONS

International Search Report for Application No. PCT/JP2013/006729 dated Feb. 4, 2014.
International Search Report for Application No. PCT/JP2013/006728 dated Jan. 7, 2014.
Office Action for Japanese Application JP-2012-253979 dispatched on Jan. 19, 2016.
Office Action issued in U.S. Appl. No. 14/443,451 dated May 13, 2016.
Office Action issued in U.S. Appl. No. 14/443,691 dated May 11, 2016.
Office Action issued in U.S. Appl. No. 14/443,691 dated Sep. 13, 2016.
Office Action issued in U.S. Appl. No. 14/443,451 dated Sep. 13, 2016.
Chinese Office Action issued in Application No. 201380060339.4 dated Sep. 5, 2016.
Chinese Office Action issued in Application No. 201380060403.9 dated Sep. 12, 2016.
Japanese Office Action issued in Application No. 2012-253979 dated Aug. 9, 2016.
Machine Translation of Japanese Patent Application No. 2006-319378 (application published on Nov. 24, 2006 and cited to USPTO on May 18, 2015).

* cited by examiner

MOUNTING DEVICE M3

| No | COMPONENT INFORMATION | MOUNTING COORDINATES | | |
|---|---|---|---|---|
| | | X | Y | θ |
| 1 | A | X1 | Y1 | θ1 |
| 2 | A | X2 | Y2 | θ2 |
| 3 | A | X3 | Y3 | θ3 |
| 4 | A | X4 | Y4 | θ4 |
| ⋮ | ⋮ | ⋮ | ⋮ | ⋮ |

MOUNTING DEVICE M4

| No | COMPONENT INFORMATION | MOUNTING COORDINATES | | |
|---|---|---|---|---|
| | | X | Y | θ |
| 1 | B | X1 | Y1 | θ1 |
| 2 | B | X2 | Y2 | θ2 |
| 3 | B | X3 | Y3 | θ3 |
| 4 | C | X4 | Y4 | θ4 |
| ⋮ | ⋮ | ⋮ | ⋮ | ⋮ |

MOUNTING DEVICE M5

| No | COMPONENT INFORMATION | MOUNTING COORDINATES | | |
|---|---|---|---|---|
| | | X | Y | θ |
| 1 | C | X1 | Y1 | θ1 |
| 2 | D | X2 | Y2 | θ2 |
| 3 | D | X3 | Y3 | θ3 |
| 4 | D | X4 | Y4 | θ4 |
| ⋮ | ⋮ | ⋮ | ⋮ | ⋮ |

| No | COMPONENT INFORMATION | SIZE X | SIZE Y | SIZE Z | MOUNTING MODE |
|---|---|---|---|---|---|
| 1 | A | XA | YA | ZA | 1 |
| 2 | B | XB | YB | ZB | 1 |
| 3 | C | XC | YC | ZC | 2 |
| 4 | D | XD | YD | ZD | 2 |
| ... | ... | ... | ... | ... | ... |

| No | MOUNTING MODE | EFFICIENCY OF MOUNTING MODE X | EFFICIENCY OF MOUNTING MODE Y | EFFICIENCY OF MOUNTING MODE θ | FOLLOW-UP RATIO R(%) X | FOLLOW-UP RATIO R(%) Y | FOLLOW-UP RATIO R(%) θ | LIMIT VALUE (mm) X | LIMIT VALUE (mm) Y | LIMIT VALUE (mm) θ |
|---|---|---|---|---|---|---|---|---|---|---|
| 1 | 1 | ○ | ○ | ○ | 70 | 70 | 70 | dXA | dYA | dθA |
| 2 | 1 | ○ | ○ | × | 50 | 50 | — | dXB | dYB | — |
| 3 | 2 | — | — | — | — | — | — | — | — | — |
| 4 | 2 | — | — | — | — | — | — | — | — | — |
| ... | ... | ... | ... | ... | ... | ... | ... | ... | ... | ... |

40a  40e  40f  40g  40h

ELECTRONIC COMPONENT MOUNTING SYSTEM AND ELECTRONIC COMPONENT MOUNTING METHOD

TECHNICAL FIELD

The present invention relates to an electronic component mounting system for mounting an electronic component on a substrate, and to an electronic component mounting method.

BACKGROUND ART

An electronic component mounting system for manufacturing a mounted substrate by mounting an electronic component on a substrate by a solder joint is configured to link a plurality of devices for mounting electronic components together, such as a solder printing device, an electronic component mounting device, or a reflow device. In this electronic component mounting system, a position correction technology which feeds forward solder position information which is obtained by actually measuring a solder printing position with respect to a post-process, in order to prevent a mounting defect generated due to solder printing position shift with respect to an electrode which is formed for the solder joint on the substrate. (see PTL 1, for instance).

In an example illustrated in PTL 1, a printing inspection device is disposed between the printing device and the electronic component mounting device to detect printing position shift, and the correction information of a mounting position for making an influence of the printing position shift minimized is transmitted to the post-process electronic component mounting device. Accordingly, it is possible to mitigate an influence of the printing position shift by using a so-called self-alignment effect in which the electronic component gravitates with respect to the electrode due to surface tension of molten solder in a reflow process after mounting the component, and to ensure mounting quality in a mounted substrate manufacturing process.

CITATION LIST

Patent Literature

[PTL 1] JP-A-2003-229699

SUMMARY OF INVENTION

Technical Problem

However, the above-described self-alignment effect does not uniformly act on any type of electronic component, and the degree of action is different according to the shape of the electrode, size and mass of the component, and characteristics of the used solder. For example, in a large-sized component having a large mass, a suction force due to the surface tension is not sufficient to move the electronic component, and a sufficient effect cannot be obtained. In addition, when a planar shape or disposition of the electronic component is asymmetrical, an asymmetrical suction force to rotate the electronic component when the solder is melting acts, and it is difficult to obtain an expected alignment effect.

However, in the related art including the above-described PTL, mounting position correction of considering the solder printing position as a reference is uniformly employed regardless of the type of the electrode and the electronic component, and further, regardless of the type of the electronic component mounting device in the system having the plurality of electronic component mounting devices. For this reason, according to the type of the electronic component on the same substrate, a joint defect may be caused in the process of the solder joint by employing the position correction. In this manner, in mounting the electronic component in the related art, the method of the mounting position correction of considering the solder printing position as a reference may not be necessarily appropriate, and an expected joint quality improvement effect may not be obtained.

Here, an object of the present invention is to provide an electronic component mounting system and an electronic component mounting method which can appropriately employ mounting position correction of considering the solder printing position as a reference, and can obtain an expected joint quality improvement effect.

Solution to Problem

An electronic component mounting system of the present invention is configured to link a plurality devices for mounting electronic components and manufactures a mounted substrate by mounting an electronic component on a substrate. The electronic component mounting system includes: a printing device which prints a solder on an electrode for an electronic component joint which is formed on the substrate; a positional-shift amount calculation portion which calculates a positional-shift amount between a position of the electrode and a position of the printed solder; a plurality of electronic component mounting devices which pick up the electronic component from a component supply portion with a mounting head, and transfer and mount the electronic component to a mounting position of the substrate on which the solder is printed; and a mounting information storage portion which stores mounting information that defines a mode of a mounting operation in the electronic component mounting device. The mounting information includes mounting mode information, which sets any one of a first mounting mode in which the electronic component is transferred and mounted to the mounting position which is corrected based on the calculated positional-shift amount and a second mounting mode in which the electronic component is transferred and mounted to the mounting position by considering only the position of the electrode as a reference regardless of the positional-shift amount, as a mounting mode for performance in advance for each electronic component mounting device. The electronic component mounting device mounts the electronic component on the substrate according to the mounting mode which is set for the electronic component mounting device with reference to the mounting information.

An electronic component mounting method of the present invention is an electronic component mounting method for manufacturing a mounted substrate by mounting an electronic component on a substrate, by an electronic component mounting system which is configured to link a plurality of devices for mounting electronic components. The electronic component mounting method includes: a printing step of printing a solder on an electrode for an electronic component joint which is formed on the substrate; a solder position detecting step of detecting a position of the printed solder; a positional-shift amount calculation step of calculating a positional-shift amount between a position of the electrode and the position of the printed solder; and an electronic component mounting step of picking up the electronic component from a component supply portion with a mounting head, and transferring and mounting the electronic component to a mounting position of the substrate on which the solder is printed according to the mounting mode set in advance. Any one of a first mounting mode in which the electronic component is transferred and mounted to the mounting position which is corrected based on the calculated positional-shift amount and a second mounting mode in which the electronic component is transferred and mounted to the mounting position by considering only the position of the electrode as a reference regardless of the positional-shift amount, is set in advance as a mounting mode for performance for each electronic component mounting device.

Advantageous Effects of Invention

According to the present invention, it is possible to detect the position of the printed solder, to calculate the positional-shift amount between the position of the electrode and the position of the printed solder, to set any one of the first mounting mode in which the electronic component is transferred and mounted to the mounting position which is corrected based on the calculated positional-shift amount and the second mounting mode in which the electronic component is transferred and mounted to the mounting position by considering only the position of the electrode as a reference regardless of the positional-shift amount, as the mounting mode for performance for each electronic component mounting device, to appropriately employ the mounting position correction which considers the solder printing position as a reference in accordance with characteristics of the electronic component which is a target to be mounted in each electronic component mounting device by mounting the electronic component on the substrate according to the mounting mode set in advance for each electronic component in component mounting work, and to obtain an expected joint quality improvement effect.

BRIEF DESCRIPTION OF DRAWINGS

FIG. 5 is a view illustrating a configuration of mounting information in the electronic component mounting device of the first embodiment of the present invention.

FIGS. 6(a) and 6(b) are views illustrating a configuration of mounting mode information in the electronic component mounting device of the first embodiment of the present invention.

DESCRIPTION OF EMBODIMENTS

First Embodiment

Figure 1:
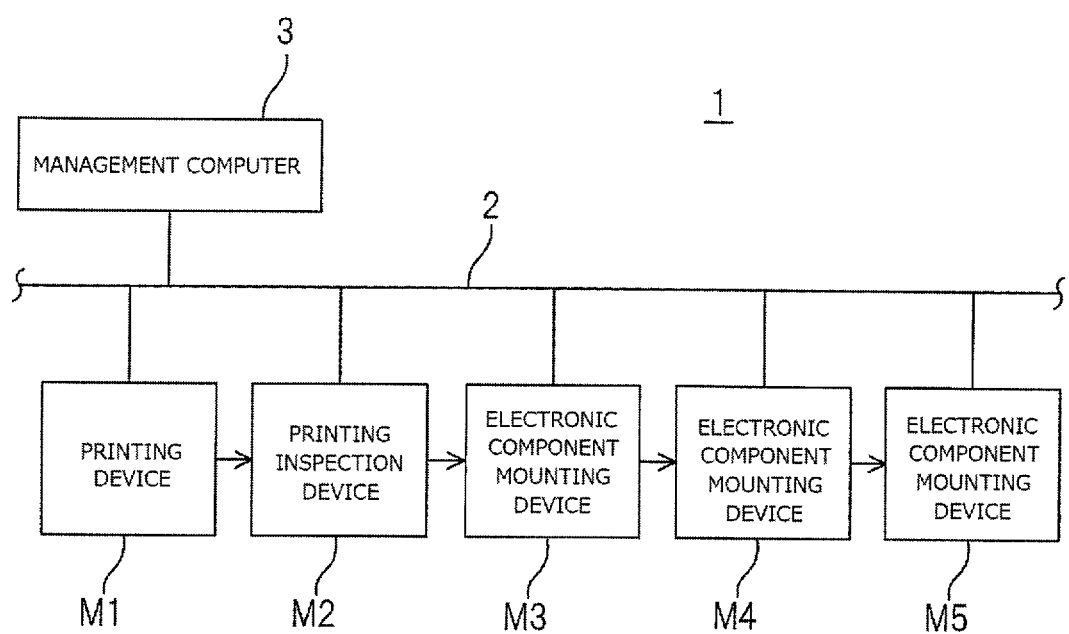
FIG. 1 is a block diagram illustrating a configuration of an electronic component mounting system of a first embodiment of the present invention.

First, an electronic component mounting system in the first embodiment will be described with reference to FIG. 1. An electronic component mounting system 1 in FIG. 1 has a function of manufacturing a mounted substrate by mounting an electronic component on a substrate, and is configured by joining a printing device M1, a printing inspection device M2, and each of electronic component mounting devices M3 to M5 which are a plurality of devices for mounting electronic components through a communication network 2, and to control the entire system through a management computer 3.

The printing device M1 screen-prints a pasty solder on an electrode for an electronic component joint formed on a substrate. By imaging the substrate after printing, the printing inspection device M2 performs printing inspection for determining whether or not a printing state of the printed solder is excellent, detects a position of the printed solder, and further performs processing of calculating a positional-shift amount between a position of the electrode and the position of the printed solder. In other words, the printing inspection device M2 has both a function of a solder position detection portion which detects the position of the printed solder and a positional-shift amount calculation portion which calculates the positional-shift amount between the position of the electrode and the position of the printed solder.

The electronic component mounting devices M3 to M5 pick up the electronic component from a component supply portion with a mounting head, and transfer and mount the electronic component to a mounting position of the substrate on which the solder is printed. After this, the mounted substrate is manufactured as the substrate after mounting the component and is sent to a reflow step and the electronic component mounted on the substrate is solder-joined to the substrate.

Figure 2:
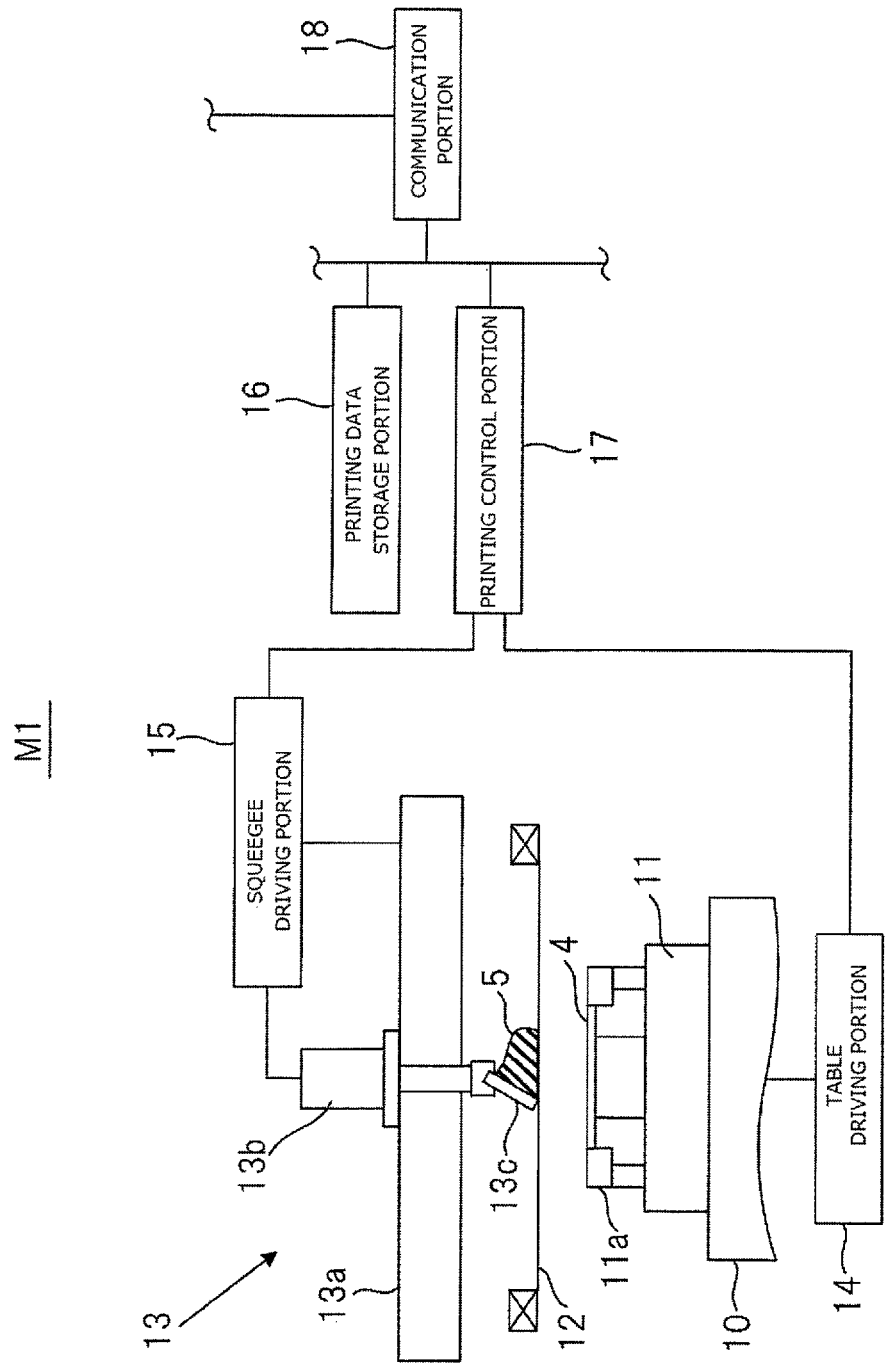
FIG. 2 is a block diagram illustrating a configuration of a printing device of the first embodiment of the present invention.

Next, configurations of respective devices will be described. First, with reference to FIG. 2, a configuration of the printing device M1 will be described. In FIG. 2, a board holding portion 11 is installed on a positioning table 10. The board holding portion 11 holds a substrate 4 with the substrate 4 sandwiched by a clamper 11a from both sides. Above the board holding portion 11, a mask plate 12 is installed, and a pattern hole (not illustrated) which corresponds to a printing position of the substrate 4 is provided in the mask plate 12. By driving the positioning table 10 with a table driving portion 14, the substrate 4 relatively moves in a horizontal direction and in a vertical direction with respect to the mask plate 12.

A squeegee portion 13 is installed above the mask plate 12. The squeegee portion 13 raises and lowers a squeegee 13c with respect to the mask plate 12, and is made of a raising and lowering pressing mechanism 13b which presses the squeegee 13c against the mask plate 12 with a predetermined pressing force, and a squeegee moving mechanism 13a which horizontally moves the squeegee 13c. The raising and lowering pressing mechanism 13b and the squeegee moving mechanism 13a are driven with a squeegee driving portion 15. In a state where the substrate 4 abuts against a lower surface of the mask plate 12, by horizontally moving the squeegee 13c at a predetermined speed along a surface of the mask plate 12 to which a solder 5 is supplied, the solder 5 is printed on an electrode 6 (refer to FIGS. 7(a) to 7(c) and FIGS. 8(a) to 8(c)) for a joint formed on an upper surface of the substrate 4 via the pattern hole.

This printing operation is performed by controlling the table driving portion 14 and the squeegee driving portion 15 with a printing control portion 17. When this control is performed, based on printing data stored in a printing data storage portion 16, an operation of the squeegee 13c and position alignment between the substrate 4 and the mask plate 12 are controlled. A communication portion 18 receives data between the communication portion and other devices which constitute the management computer 3 or the electronic component mounting system 1 via the communication network 2.

Figure 3:
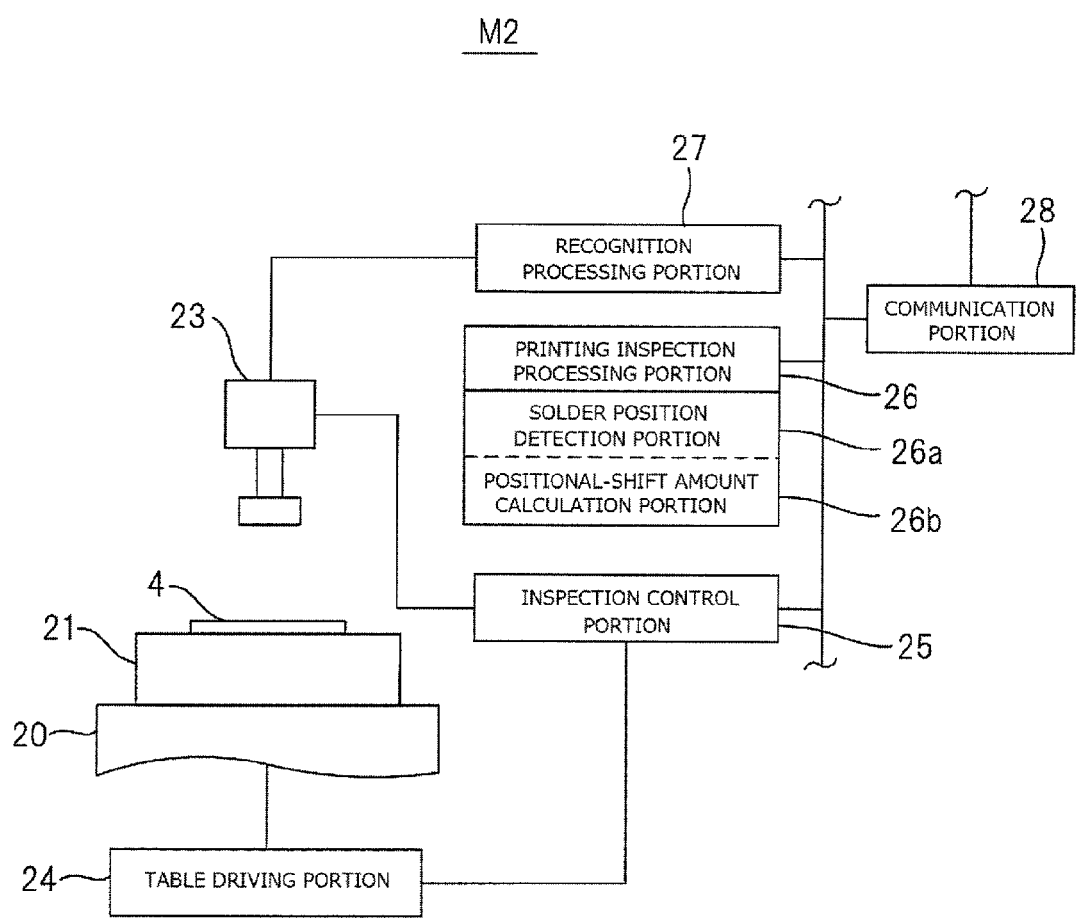
FIG. 3 is a block diagram illustrating a configuration of a printing inspection device of the first embodiment of the present invention.

Next, with reference to FIG. 3, the printing inspection device M2 will be described. In FIG. 3, a board holding portion 21 is disposed above a positioning table 20, and the substrate 4 is held in the board holding portion 21. An inspection camera 23 is installed above the board holding portion 21 by setting an imaging direction to be downward, and the inspection camera 23 images the substrate 4 in a state where the solder is printed by the printing device M1. By controlling a table driving portion 24 and the inspection camera 23, an inspection control portion 25 controls a detecting operation. By controlling the table driving portion 24 with the inspection control portion 25 and driving the positioning table 20, it is possible to position and image an arbitrary position of the substrate 4 immediately below the inspection camera 23.

Image data which is obtained by performing imaging is recognition-processed by a recognition processing portion 27, and the recognition result is sent to a printing inspection processing portion 26. The printing inspection processing portion 26 is provided with a solder position detection portion 26a and a positional-shift amount calculation portion 26b, and the solder position detection portion 26a detects the position of the solder printed on the substrate 4 with the printing device M1 and outputs solder position data. The positional-shift amount calculation portion 26b calculates the positional-shift amount between the position of the electrode 6 and the position of the printed solder 5 based on the solder position data. In addition, based on these detection results, the printing inspection processing portion 26 determines acceptance of a solder printing state. In addition, the solder position data or the positional-shift amount are output as feedforward data, and sent to the management computer 3 or other devices (in the present embodiment, electronic component mounting devices M3 to M5) via communication portion 28 and the communication network 2.

Figure 4:
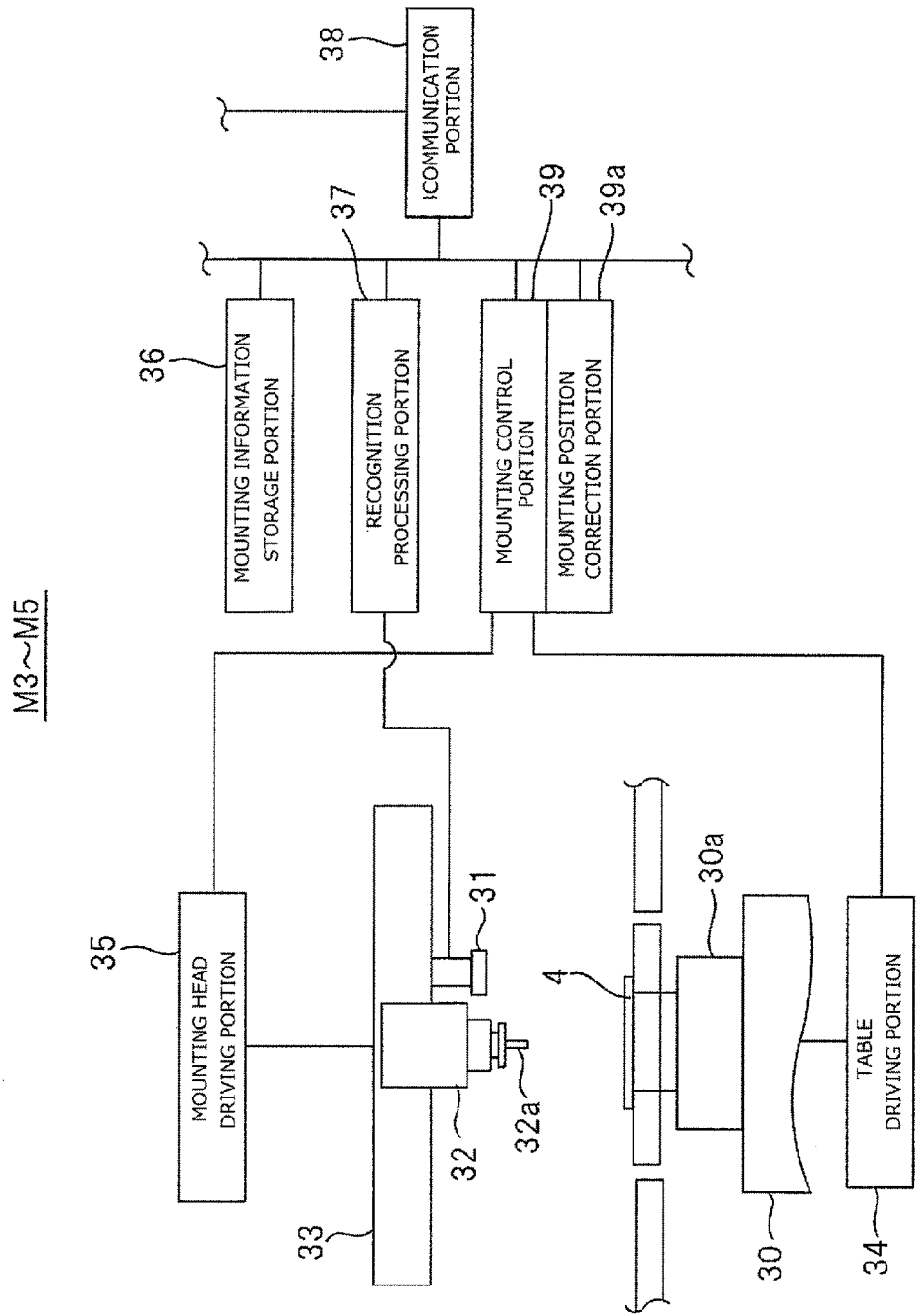
FIG. 4 is a block diagram illustrating a configuration of an electronic component mounting device of the first embodiment of the present invention.

Next, with reference to FIG. 4, a configuration of the electronic component mounting devices M3 to M5 will be described. In FIG. 4, a board holding portion 30a is installed above a positioning table 30, and the board holding portion 30a holds the substrate 4 which is conveyed from printing inspection device M2 or the electronic component mounting device on an upstream side. Above the board holding portion 30a, a mounting head 32 which moves via a head driving mechanism 33 is installed. The mounting head 32 is provided with a nozzle 32a which sucks up the electronic component, and the mounting head 32 sucks up, holds, and removes the electronic component from the component supply portion (not illustrated) by the nozzle 32a. In addition, by moving the mounting head 32 onto the substrate 4 and lowering the mounting head 32 with respect to the substrate 4, an electronic component 7 (refer to FIGS. 7(a) to 7(c) and FIGS. 8(a) to 8(c)) which is held by the nozzle 32a is transferred and mounted to the substrate 4.

In the head driving mechanism 33, a board recognition camera 31 which moves while being integrated with the mounting head 32 is installed by setting an imaging surface to be downward, and by moving the board recognition camera 31 onto the substrate 4, the substrate is imaged. In addition, as the imaging result is recognition-processed by a recognition processing portion 37, position recognition regarding a board recognition mark or a mounting point on the substrate 4 is performed.

The head driving mechanism 33 and the positioning table 30 are respectively driven by a mounting head driving portion 35 and a table driving portion 34, and the mounting head driving portion 35 and the table driving portion 34 are controlled by a mounting control portion 39. The mounting control portion 39 includes a mounting position correction portion 39a used during an internal processing function, and performs processing of correcting the mounting position before performing component mounting based on the positional-shift amount which is calculated by the positional-shift amount calculation portion 26b in the printing inspection device M2 and fed forward to the electronic component mounting device M3. In the control processing by the mounting control portion 39, mounting information 40 (refer to FIGS. 5, 6(a), and 6(b)) which is stored in a mounting information storage portion 36 is referred to. The mounting information 40 is information which defines the performance mode of a performed operation through the electronic component mounting device.

Here, with reference to FIGS. 5, 6(a), and 6(b), the mounting information 40 will be described. First, with reference to FIG. 5, mounting information 40(1) will be described. The mounting information 40(1) indicates a type of the electronic component which is a target to be mounted and mounting coordinates on the substrate 4 in the electronic component mounting devices M3 to M5. In other words, here, in each "mounting No." 40a which individually specifies mounting operations on the substrate, "component information" 40b (A, B, C, . . . ) which indicates a component code or the like of a target component and a "mounting coordinates" 40c (X1, Y1, θ1, . . . ) which indicate coordinate values of X, Y, and θ of mounting points at which the component is mounted, are defined with respect to each of the electronic component mounting devices M3 to M5. By reading the mounting information 40(1), a mounting sequence on the substrate of a work target is determined.

Next, with reference to FIGS. 6(a) and 6(b), mounting information 40(2) and mounting information 40(3) will be described. The mounting information 40(2) illustrated in FIG. 6(a) is mounting mode information, and is information which sets the mounting mode that defines correction state of the mounting position in advance for each electronic component with respect to the substrate which is a mounting target in the electronic component mounting devices M3 to M5. In other words, in each "mounting No" 40a which individually specifies the mounting operations on the substrate, the "component information" 40b, a "size" 40d (XA, YA, ZA, . . . ) which indicates sizes of respective X, Y, and Z directions of the target component, and a "mounting mode" 40e which indicates, by flag "1" or "2", the mounting mode for performance is the first mounting mode or the second mounting mode, are correspondingly defined.

Figure 7:
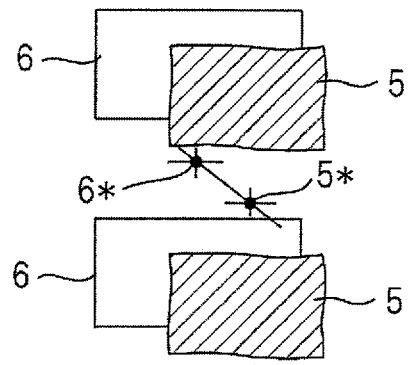
FIGS. 7(a) to 7(c) are views illustrating a first mounting mode in the electronic component mounting device of the first embodiment of the present invention.
Figure 7:
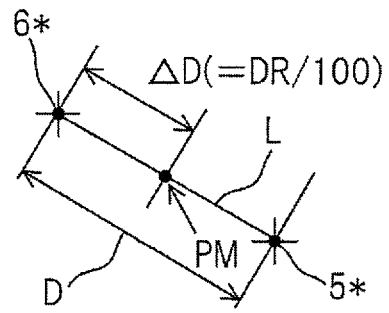
Figure 7:
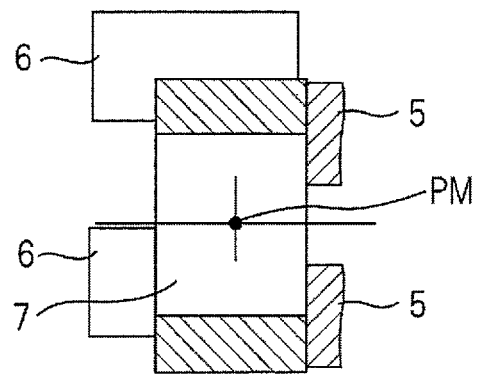

Here, the first mounting mode is a mode in which the electronic component is transferred and mounted to the mounting position which is corrected by the mounting position correction portion 39a based on the positional-shift amount which is calculated by the positional-shift amount calculation portion 26b. As illustrated in FIG. 7(a), when a position on installation data indicated by the "mounting coordinates" 40c of the mounting information 40(1), that is, a center position of one pair of electrodes 6, and a center position 5* of the printed solder 5 are position-shifted, a mounting position PM at which the electronic component 7 is to be actually mounted is obtained by a correction method illustrated in FIG. 7(b).

In the example illustrated here, an example in which the mounting position PM after the correction is set on a positional-shift line L which links the center position 6* and the center position 5* is illustrated. In other words, a point which is separated by a correction amount ΔD from the center position 6* on the positional-shift line L is set to be the mounting position PM. Here, the correction amount ΔD is calculated by multiplying the entire positional-shift amount D by a follow-up ratio R(%) (refer to FIG. 6(b)) which is set in advance. The follow-up ratio R is set as an appropriate value in advance for each type of the electronic component based on an experience value or a trial result. Here, an example in which the follow-up ratio R is 50% and the mounting position PM is set to be at the center of the positional-shift line L is illustrated. In addition, in a component mounting operation which targets the electrode 6, as illustrated in FIG. 7(c), by setting the mounting position PM calculated in this manner to be a goal, the position control of the mounting head 32 is performed.

By setting the mounting position PM by the above-described correction method, even when the positional shift is generated and the printing position of the solder 5 does not match the electrode 6, through surface tension of the molten solder which acts on the electronic component 7 when the solder 5 is melting in a reflow process after mounting the component, it is possible to reduce an influence of the printing position shift and to suppress a generation ratio of a mounting defect to be low via a self-alignment effect in which the electronic component 7 gravitates to the electrode 6 together with molten solder. This self-alignment effect is likely to generate the component movement through the surface tension of the molten solder, such as in an extremely small-sized chip component, and is particularly effective with respect to a small-sized component. For this reason, in the embodiment, when the electronic component 7 to be a target corresponds to the small-sized component, the first mounting mode is employed.

Figure 8:
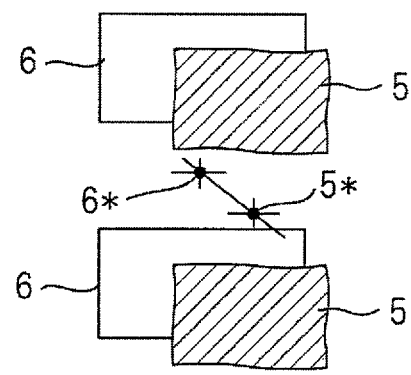
FIGS. 8(a) to 8(c) are views illustrating a second mounting mode in the electronic component mounting device of the first embodiment of the present invention.
Figure 8:
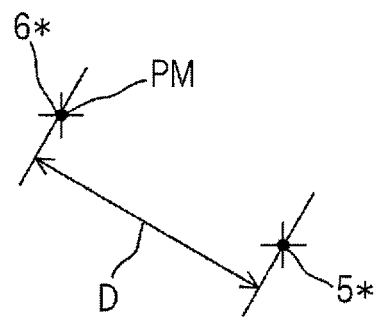
Figure 8:
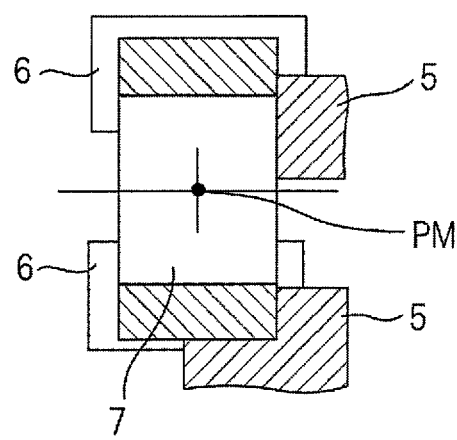

In contrast, the second mounting mode is a mode in which the electronic component is transferred and mounted to the mounting position by setting only the position of the electrode 6 as a reference regardless of the amount of solder positional shift. In other words, as illustrated in FIG. 8(a), the center position 6* of one pair of electrodes 6 and the center position 5* of the printed solder 5 are position-shifted, and even when the center position 6* and the center position 5* are separated only by the positional-shift amount D (FIG. 8(b)), the center position is set to be the mounting position PM by considering only the position of the electrode 6 as a reference. In addition, as illustrated in FIG. 8(c), by setting the mounting position PM which is set in this manner to be a goal, the position control of the mounting head 32 is performed. In the embodiment, the second mounting mode is employed in a large-sized electronic component, such as a connector component in which efficiency of the effect of the above-described self-alignment cannot be expected.

Next, the mounting information 40(3) illustrated in FIG. 6(b) will be described with reference to FIGS. 9(a) and 9(b). The mounting information 40(3) is mode employed selection information for selecting the employed mounting mode, and is data which defines the range of employing the first mounting mode, the follow-up ratio R when the first mounting mode is employed, and a control value of the correction amount in a case where the first mounting mode is employed. In other words, in each "mounting No" 40a which individually specifies the mounting operations on the substrate, the "mounting mode" 40e and "efficiency of mounting mode" 40f which are similar to the mounting information 40(1), a "follow-up ratio R" 40g, and a "limit value" 40h are defined.

Figure 9:
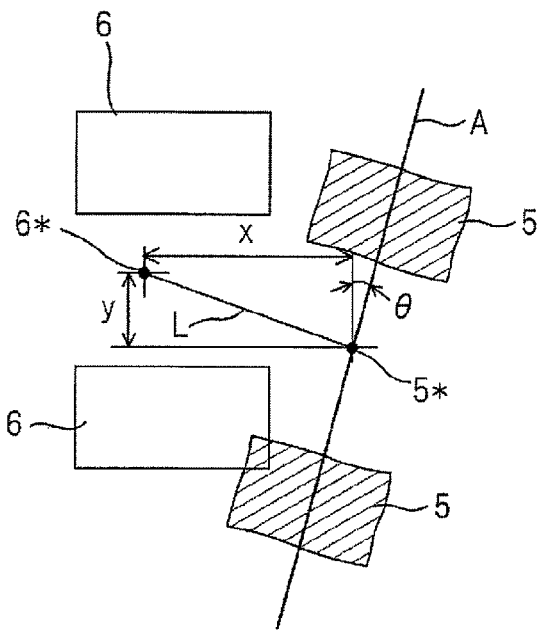
FIGS. 9(a) and 9(b) are views illustrating employed selection information of the first mounting mode in the electronic component mounting device of the first embodiment of the present invention.
Figure 9:
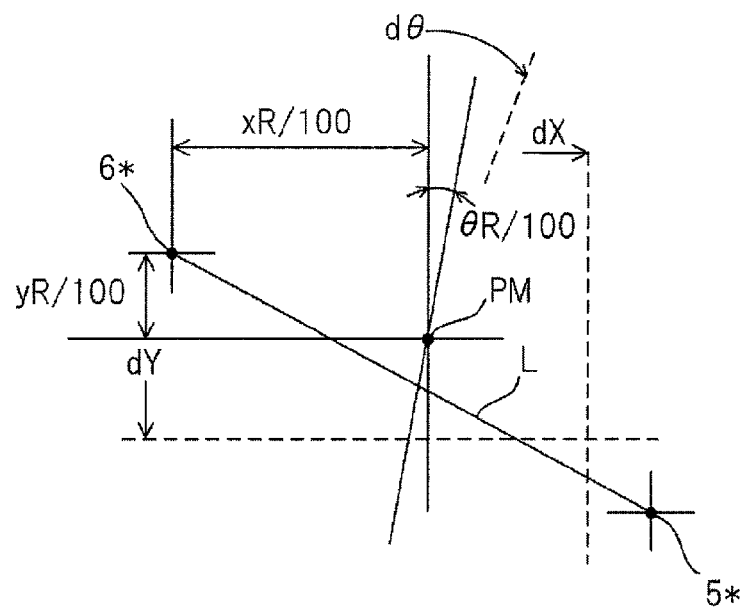

As illustrated in FIG. 9(a), a solder positional shift state of the solder 5 with respect to one pair of electrodes 6 is expressed by components x and y in two horizontal directions of the positional-shift line L illustrating the positional-shift amount and the direction, and a shift angle θ of a direction line A illustrating one pair of printed solder 5 with respect to a reference direction (arrangement direction of the electrode 6). In addition, here, the positional shift state is drawn to be exaggerated in order to make the drawings easy to understand, and such a large positional shift is not the target in practice.

In mounting position correction which considers this solder positional shift state as a target, the "efficiency of mounting mode" 40f defines whether or not the correction method based on the amount of solder positional shift is employed separately in three directions, such as the X, Y, and θ directions of the amount of solder positional shift. In other words, among the three directions, such as the X, Y, and θ directions in the "efficiency of mounting mode" 40f, only in a direction in which an ○ mark is attached, the mounting position correction is employed. In addition, the "follow-up ratio R" 40g defines the follow-up ratio R(%) when the correction amount is obtained in each direction in which the ○ mark is attached in the "efficiency of mounting mode" 40f. In other words, as illustrated in FIG. 9(b), when computing the corrected mounting position PM, the correction amount of each direction is obtained by multiplying the follow-up ratio R(%) which is defined for each direction by the components x, y, and θ of the positional shift illustrated in FIG. 9(a).

In other words, in the mounting information 40, the follow-up ratio R(%) which indicates a ratio of the correction amount with respect to the positional-shift amount of the solder 5 calculated by the positional-shift amount calculation portion 26b is included, and the electronic component mounting devices M3 to M5 mount the electronic component 7 to the mounting position PM which is corrected according to the follow-up ratio R(%) which is set in advance. The "follow-up ratio R" 40g which is included in the mounting information 40(3) is configurable for each component of the positional-shift amount in the X direction, in the Y direction, and in the θ direction.

Furthermore, the "limit value" 40h is information used for defining the upper limit value in advance when defining the correction amount for each direction in which the position correction is employed. In the mounting position correction, since there is a case where a joint defect is rather negatively influenced when the correction amount is excessively set according to the type of component, the upper limit of the allowable correction amount is set in advance as the limit value with respect to the electronic component having such characteristics regardless of the amount of solder positional shift.

In other words, in the embodiment, the performance mode of the mounting operation is defined by the electronic component mounting devices M3 to M5, and the mounting information 40 which is stored in the mounting information storage portion 36 includes the limit value illustrating the upper limit of the allowable correction amount in mounting position correction which corrects the mounting position based on the positional-shift amount of the solder 5 calculated by the positional-shift amount calculation portion 26b of the printing inspection device M2. In addition, if the correction amount which is calculated based on the positional-shift amount of the solder 5 by the mounting position correction portion 39a exceeds the limit value which is defined by the "limit value" 40h, the electronic component 7 is mounted on the mounting position PM which is corrected by considering the limit value as the correction amount.

In this manner, by defining the "efficiency of mounting mode" 40f, the "follow-up ratio R" 40g, and the "limit value" 40h in advance for each electronic component, it is possible to elaborately employ the mounting position correction which considers the solder printing position as a reference in accordance with the characteristics of the electronic component. In other words, by combining the shape of the electrode 6, the size and the shape of the electronic component 7, or the viscosity of the solder 5, a state or frequency distributions of generation of individual mounting defects become different from each other. According to this, a trial of the device done by shifting the mounting position PM little by little is performed, and data which indicates a correlation between the mounting position PM and a degree of generation of the mounting defect is experimentally obtained in advance. Then, by storing these data as the mounting information 40 and employing these data in accordance with the electronic component 7 to be a target, when a fine component is mounted on a fine pitch circuit board, it is also possible to ensure excellent solder joint quality with respect to an application example in which mounting difficulty is high.

Figure 10:
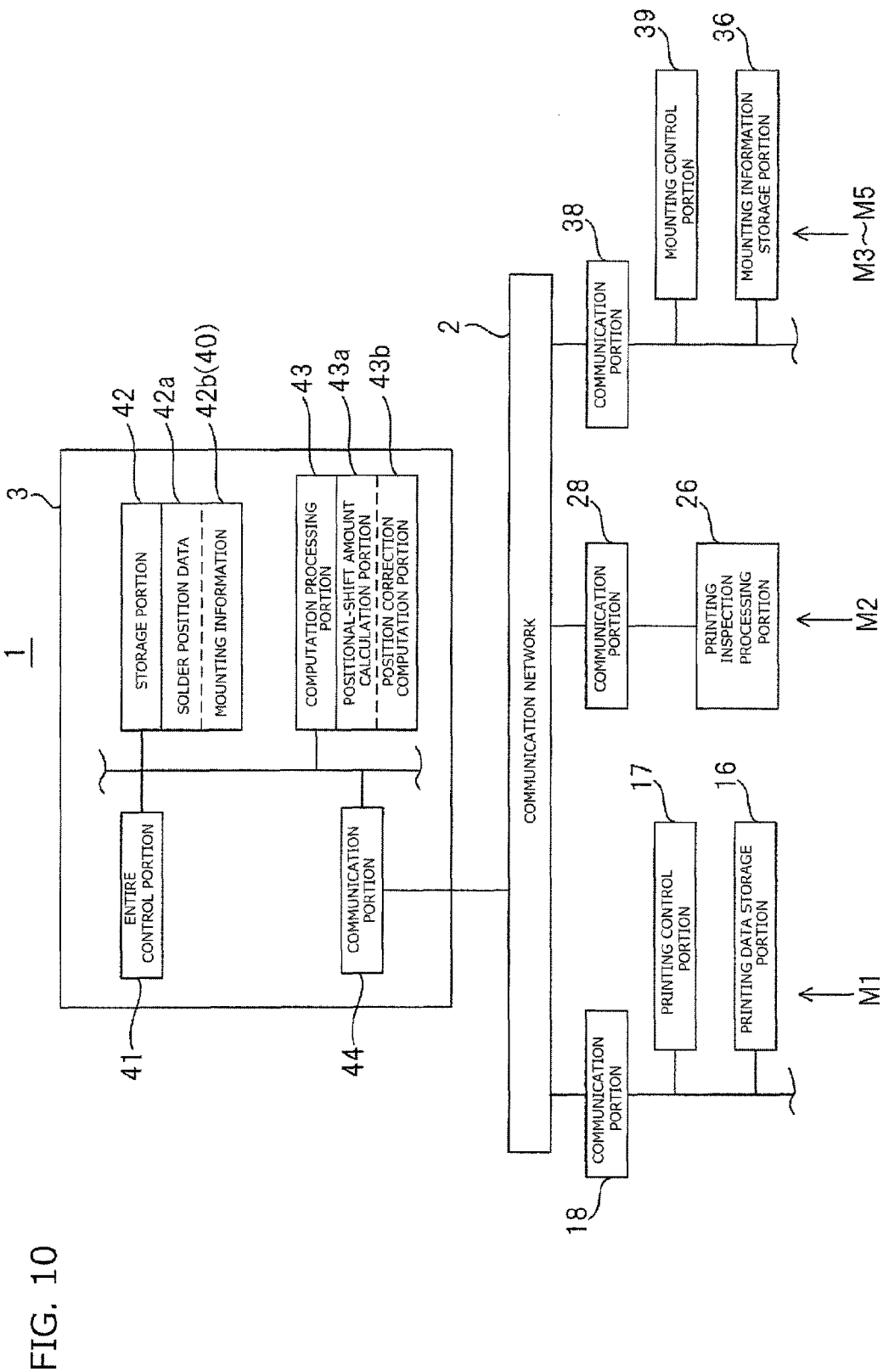
FIG. 10 is a block diagram illustrating a configuration of a control system of the electronic component mounting system of the first embodiment of the present invention.

Next, with reference to FIG. 10, a configuration of a control system of the electronic component mounting system 1 will be described. In FIG. 10, the management computer 3 includes an entire control portion 41, a storage portion 42, and a computation processing portion 43, and is connected to the communication network 2 via a communication portion 44. The entire control portion 41 includes a function of encompassing the control in each device which constitutes the electronic component mounting system 1. The storage portion 42 stores solder position data 42a and mounting information 42b which are sent from the printing inspection device M2 in addition to production management data which manages the operation which is performed by the electronic component mounting system 1. The mounting information 42b is data which is similar to the mounting information 40 stored in the mounting information storage portion 36 in the electronic component mounting devices M3 to M5.

The computation processing portion 43 performs various necessary computation processing for performing the component mounting work. During computation processing, functions of a positional-shift amount calculation portion 43a and a position correction computation portion 43b are included. Based on the position correction data 42a, the positional-shift amount calculation portion 43a performs computation for computing positional-shift amount of the solder. With reference to the mounting information 42b based on the calculated positional-shift amount of the solder, the position correction computation portion 43b performs computation for mounting position correction. In the embodiment, the computation of the positional-shift amount of the solder is performed by the positional-shift amount calculation portion 26b of the printing inspection device M2, and the computation of the mounting position correction is performed by the mounting position correction portion 39a of each of the electronic component mounting devices M3 to M5. However, the above-described computation function of the management computer 3 may perform this computation processing.

The printing data storage portion 16 and the printing control portion 17 of the printing device M1 are connected to the communication network 2 via the communication portion 18, and the printing inspection processing portion 26 of the printing inspection device M2 is connected to the communication network 2 via the communication portion 28. Accordingly, the solder position data which is obtained by the printing inspection processing portion 26 is sent to the management computer 3, and stored in the storage portion 42. The electronic component mounting devices M3 to M5 are connected to the communication network 2 via a communication portion 38. Accordingly, the mounting information 42b which is stored in the storage portion 42 is sent to each mounting device and stored as the mounting information 40 in the mounting information storage portion 36.

In the configuration of the above-described electronic component mounting system 1, the printing inspection device M2 is independently provided between the printing device M1 and the electronic component mounting device M3. However, the function of the printing inspection device M2 may belong to the printing device M1 or the electronic component mounting device M3. In other words, the inspection camera 23 is installed so that imaging is possible with respect to the substrate 4 after printing in the printing device M1, and the functions of the inspection control portion 25, the printing inspection processing portion 26, and the recognition processing portion 27 are added to the control function of the printing device M1. Accordingly, it is possible to perform, inside the printing device M1, similar inspection and solder position shift detection for the substrate 4 after printing as a target.

In addition, even when these functions belong to the electronic component mounting device M3, similarly, in this case, inside the electronic component mounting device M3, similar inspection is performed before the component mounting operation with respect to the substrate 4 which is directly conveyed from the printing device M1 occurs. For example, by imaging the substrate 4 after the solder printing with the inspection camera 23 which is separately installed, and by performing the recognition processing with the printing inspection processing portion 26 (refer to FIG. 3), similar processing is performed.

Figure 11:
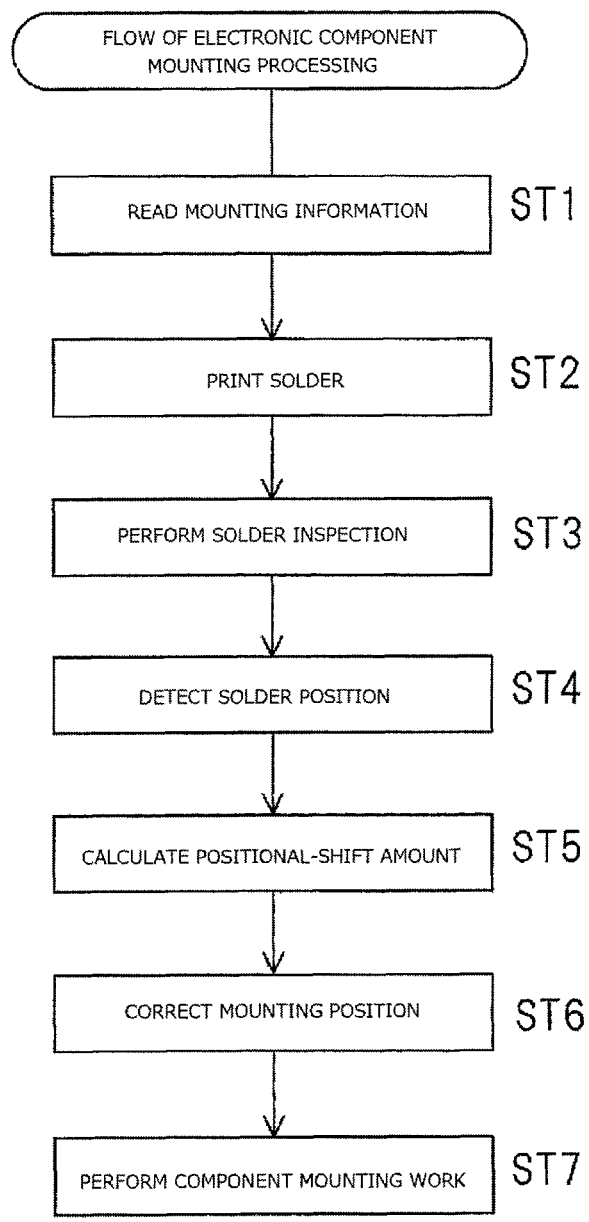
FIG. 11 is a flow chart of electronic component mounting processing by the electronic component mounting system of the first embodiment of the present invention.

This electronic component mounting system is configured as described above, and hereinafter, an electronic component mounting method for manufacturing the mounted substrate by mounting the electronic component on the substrate with the electronic component mounting system 1 will be described with reference to each drawing along the flow of FIG. 11. First, the mounting information is read before starting production (ST1). In other words, in the electronic component mounting devices M3 to M5, the mounting information 40 which is stored in the mounting information storage portion 36 is read, and accordingly, necessary information is used in the component mounting work.

Next, the solder printing is performed by considering the substrate which is conveyed into the printing inspection device M2 from the upstream side as a target (ST2). In other words, the solder 5 is printed on the electrode 6 for the electronic component joint which is formed on the substrate 4 (printing step). The substrate 4 after the solder printing is conveyed into the printing inspection device M2, and here, the solder inspection is performed (ST3). Here, the substrate 4 after the solder printing is imaged, it is determined whether or not the printing is excellent, and the position of the printed solder 5 is detected (solder position detection step) (ST4). After this, the positional-shift amount between the position of the electrode 6 and the position of the printed solder 5 is calculated (positional-shift amount calculation step) (ST5).

Next, the electronic component 7 is picked up from the component supply portion by the mounting head 32, and according to the mounting mode which is set in advance, the solder 5 is transferred and mounted to the mounting position of the substrate 4 (electronic component mounting step). In this electronic component mounting step, first, the mounting position correction processing of correcting the mounting position based on the calculated positional-shift amount is performed (ST6). Next, the component mounting work is performed (ST7), and the electronic component 7 is mounted on the mounting position PM which is corrected as illustrated in FIGS. 7(a) to 7(c) or FIGS. 8(a) to 8(c).

In the electronic component mounting step, each electronic component mounting device mounts the electronic component 7 on the substrate 4 according to the mounting mode for performance which is set in advance for each electronic component with reference to the mounting information 40(2) illustrated in FIG. 6(a). Here, as the mounting mode for performance, any one of the first mounting mode in which the electronic component 7 is transferred and mounted to the mounting position PM which is corrected based on the calculated positional-shift amount, and the second mounting mode in which the electronic component 7 is transferred and mounted to the mounting position PM by considering only the position of the electrode 6 as a reference regardless of the positional-shift amount, is set in advance for each electronic component.

With reference to mounting information 40(3) illustrated in FIG. 6(b), by reading the "efficiency of mounting mode" 40f, the "follow-up ratio R" 40g, and the "limit value" 40h, when the first mounting mode is set as the mounting mode for performance, it is determined whether or not the first mounting mode is employed with respect to each component of the positional-shift amount in the X direction, in the Y direction, and in the θ direction. Furthermore, using the positional-shift amount of the direction which is a target to be employed of the first mounting mode, the electronic component 7 is mounted on the mounting position PM which is corrected according to the follow-up ratio R(%) defined the "follow-up ratio R" 40g. Here, when the correction amount based on the calculated positional-shift amount exceeds the limit value which is defined by the "limit value" 40h, the electronic component 7 is mounted on the mounting position PM which is corrected by considering the limit value as the correction value.

In addition, the substrate 4 on which the electronic component 7 is mounted in this manner is sent to the downstream reflow step, and here, by heating the substrate according to a predetermined temperature profile, the solder component in the solder 5 is melted, and the electronic component 7 is solder-joined to the electrode 6. As described above, since the mounting position correction performed by considering the solder printing position as a reference in the electronic component mounting step is appropriately employed in accordance with the characteristics of the electronic component, it is possible to effectively achieve the self-alignment effect that alleviates the solder positional shift in the solder joint, and to obtain an expected joint quality improvement effect.

Second Embodiment

Figures 12A, 12B:
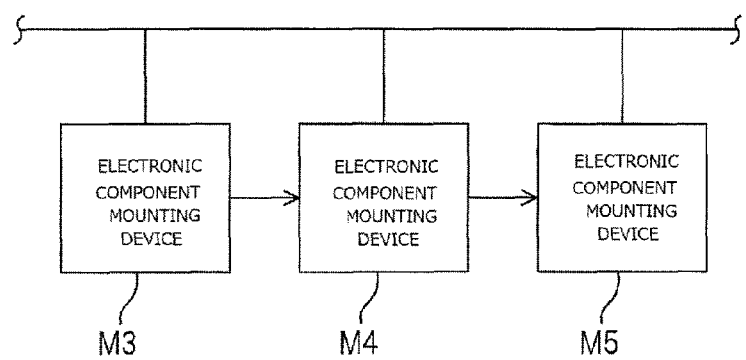
FIGS. 12(a) and 12(b) are views illustrating a configuration and mounting mode information of an electronic component mounting system of a second embodiment of the present invention.

In the second embodiment, the mounting mode which is set for each electronic component in advance in the mounting information 40 in the first embodiment is set to be fixed for each electronic component mounting device which constitutes the electronic component mounting system 1. In the electronic component mounting system 1 illustrated in FIG. 12(a), a device configuration which is similar to that of the electronic component mounting system 1 in the first embodiment is provided, and the plurality of electronic component mounting devices M3, M4, and M5 are arranged in order from the upstream side. The electronic component mounting devices M3, M4, and M5 in the first embodiment have a configuration which is similar to that in FIG. 4, and in the mounting information storage portion 36 of these electronic component mounting devices, instead of the mounting information 40(2) illustrated in FIG. 6(a), mounting information 40(4) illustrated in FIG. 12 (b) is stored.

The mounting information 40(4) corresponds to the first mounting mode and the second mounting mode which are defined by the flags "1" and "2" indicated in an "employed mounting mode" 40j, in the electronic component mounting device which is specified by a "device number" 40i. Here, the first mounting mode is made to correspond to the electronic component mounting devices M3 to M4, and the second mounting mode is made to correspond to the electronic component mounting device M5. In the component mounting work performed by the electronic component mounting devices M3, M4, and M5, the electronic component is mounted on the substrate according to the mounting mode for performance which corresponds to the electronic component mounting device with reference to the mounting information 40(4).

As described above, the first mounting mode in which mounting position correction is performed by considering the solder printing position as a reference in the electronic component mounting step is employed with respect to the small-sized component in which the component is likely to move mainly due to the surface tension of the molten solder, such as an extremely small-sized chip component. In addition, in the device configuration of the electronic component mounting system, in general, there is a strong tendency that the electronic component mounting device which considers the small-sized component, such as the chip component, as a target to be mounted is disposed on the upstream side, and the electronic component mounting device which considers the large-sized component, such as a connector component, as a target to be mounted is disposed on the downstream side.

In other words, the electronic component mounting device in which the first mounting mode is employed and which considers the small-sized component as a target to be mounted, is disposed on the upstream side of the electronic component mounting system, and the electronic component mounting device in which the second mounting mode in which the mounting position correction is performed by considering the solder printing position as a reference and which considers the large-sized component as a target to be mounted, is disposed on the downstream side of the electronic component mounting system. Therefore, when the electronic component which is a target to be mounted of the electronic component mounting system that is configured of the plurality of electronic component mounting devices is classified into two types, such as the small-sized component and the large-sized component, and when the first mounting mode and the second mounting mode are set to be fixed as the mounting mode for performance respectively in the electronic component mounting device which mounts the small-sized component and in the electronic component mounting device which mounts the large-sized component, in one electronic component mounting device, it is not necessary to divide the mounting mode for each electronic component, and substantially similar effects to those of the first embodiment can be achieved.

The present invention is described in detail with reference to specific embodiments. However, it is apparent to those skilled in the art that various modifications or revisions can be added thereto without departing from the idea and scope of the present invention.

The present application is based on Japanese Patent Application 2012-252954 filed on Nov. 19, 2012, and Japanese Patent Application 2012-253979 filed on Nov. 20, 2012, and the content thereof is included here for reference.

INDUSTRIAL APPLICABILITY

An electronic component mounting system and an electronic component mounting method of the present invention have an effect of appropriately employing a mounting position correction of considering the solder printing position as a reference, and an effect that an expected joint quality improvement effect can be obtained, and are useful in the field of mounting an electronic component on a substrate by a plurality of electronic component mounting devices with a solder joint to manufacture a mounted substrate.

REFERENCE SIGNS LIST

1 Electronic component mounting system
2 Communication network
3 Management computer
4 Printed circuit board
5 Solder
6 Electrode
7 Electronic component
23 Inspection camera
32 Mounting head
M1 Printing device
M2 Printing inspection device
M3 to M5 Electronic component mounting device
PM Mounting position

The invention claimed is:

1. An electronic component mounting system that is configured by joining a plurality of devices for mounting electronic components and mounts an electronic component on a substrate to manufacture a mounted substrate, the system comprising;
a printing device that prints solder on an electrode for an electronic component joint which is formed on the substrate;
a positional-shift amount calculation portion that calculates a positional-shift amount between a position of the electrode and a position of the printed solder;
a plurality of electronic component mounting devices that pick up the electronic component from a component supply portion with a mounting head, and transfer and mount the electronic component to a mounting position of the substrate on which the solder is printed; and
a mounting information storage portion that stores mounting information that defines a mode of a mounting operation in the electronic component mounting device, wherein
the mounting information includes mounting mode information as to which one of a first mounting mode and a second mounting mode is employed for each of the plurality of electronic component mounting devices as a mounting mode for performance, the first mounting mode is a mode in which the electronic component is mounted to the mounting position which is corrected based on the calculated positional-shift amount, and the second mounting mode is a mode in which the electronic component is mounted to the mounting position by considering only the position of the electrode as a reference regardless of the positional-shift amount, and
the electronic component mounting device mounts the electronic component on the substrate according to the mounting mode which is set for the electronic component mounting device with reference to the mounting information.

2. An electronic component mounting method of mounting an electronic component on a substrate to manufacture a mounted substrate by an electronic component mounting system configured by joining a plurality of devices for mounting electronic components, the method comprising:
a printing step of printing a solder on an electrode for an electronic component joint which is formed on the substrate;
a solder position detecting step of detecting a position of the printed solder;
a positional-shift amount calculation step of calculating a positional-shift amount between a position of the electrode and the position of the printed solder; and
an electronic component mounting step of picking up the electronic component from a component supply portion by a mounting head, and transferring and mounting the electronic component to a mounting position of the substrate on which the solder is printed according to the mounting mode set in advance, wherein
any one of a first mounting mode and a second mounting mode is set in advance for each electronic component mounting device as a mounting mode for performance, the first mounting mode is a mode in which the electronic component is mounted to the mounting position which is corrected based on the calculated positional-shift amount, and the second mounting mode is a mode in which the electronic component is mounted to the mounting position by considering only the position of the electrode as a reference regardless of the positional-shift amount,
wherein the electronic component mounting method further comprises selecting the mounting mode for performance from the first mounting mode and the second mounting mode for each of the plurality of electronic component mounting devices.

* * * * *